(12) United States Patent
Wong et al.

(10) Patent No.: US 9,899,794 B2
(45) Date of Patent: Feb. 20, 2018

(54) OPTOELECTRONIC PACKAGE

(71) Applicant: Texas Instruments Incorporated, Dallas, TX (US)

(72) Inventors: Will Kiang Wong, Belmont, CA (US); Roozbeh Parsa, Portola Valley, CA (US); William French, San Jose, CA (US); Noboru Nakanishi, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 265 days.

(21) Appl. No.: 14/319,696

(22) Filed: Jun. 30, 2014

(65) Prior Publication Data

US 2015/0380895 A1   Dec. 31, 2015

(51) Int. Cl.
*H01L 31/0232*   (2014.01)
*H01S 5/022*   (2006.01)
*H01L 31/0203*   (2014.01)
*H01L 31/02*   (2006.01)
*H01L 31/167*   (2006.01)
(Continued)

(52) U.S. Cl.
CPC .... *H01S 5/02276* (2013.01); *H01L 31/02002* (2013.01); *H01L 31/0203* (2013.01); *H01L 31/167* (2013.01); *H01L 31/173* (2013.01); *H01L 2224/48091* (2013.01); *H01L 2224/48464* (2013.01); *H01L 2224/73265* (2013.01); *H01L 2924/16152* (2013.01); *H01S 5/02208* (2013.01); *H01S 5/02248* (2013.01); *H01S 5/183* (2013.01)

(58) Field of Classification Search
CPC ........... H01L 23/49575; H01L 23/3107; H01L 2224/48091; H01L 2224/48464; H01L 2224/73265; H01L 2924/00014; H01L 2924/16152; H01L 31/02002; H01L 31/0203; H01L 31/167; H01L 31/173; H01L 5/02208; H01L 5/02276; H01L 5/183
USPC ................................... 257/432, 459; 438/25
See application file for complete search history.

(56) References Cited

U.S. PATENT DOCUMENTS 5,304,819 A   4/1994 Torazawa et al.
5,345,038 A   9/1994 Miyauchi et al.
(Continued)

OTHER PUBLICATIONS

Notification of Transmittal of the International Search Report and the Written Opinion of the Internationqal Searching Authority, or the Declaration, dated Oct. 22, 2015.

*Primary Examiner* — Vongsavanh Sengdara
(74) *Attorney, Agent, or Firm* — Jacqueline J. Garner; Charles A. Brill; Frank D. Cimino

(57) ABSTRACT

A optoelectronic package includes an inner package with a dielectric substrate having at least a first dielectric level with a photodetector (PD) die on a die attach area, first routing connecting a first contact to a first external bond pad (FEBP), and second routing connecting a second contact to a second external bond pad (SEBP). An outer package (OP) includes a ceramic substrate including a light source die on a base portion in direct line of sight with the PD including a first electrode and second electrode. A first wire bond connects the FEBP to a first terminal, a second wire bond connects the SEBP to a second terminal, a third wire bond connects the first electrode to a third terminal, and a fourth wire bond connects the second electrode to a fourth terminal.

11 Claims, 5 Drawing Sheets

(51) Int. Cl.
   *H01L 31/173*   (2006.01)
   *H01S 5/183*    (2006.01)

(56) References Cited

U.S. PATENT DOCUMENTS

| | | | |
|---|---|---|---|
| 6,388,264 | B1 | 5/2002 | Pace |
| 6,548,880 | B1 | 4/2003 | Hirasawa |
| 6,991,381 | B2 | 1/2006 | Kropp |
| 7,064,835 | B2 | 6/2006 | Riley, Jr. et al. |
| 7,745,918 | B1 * | 6/2010 | Woodyard ........ H01L 23/49548 257/686 |
| 8,749,039 | B2 * | 6/2014 | Onodera ................ H01L 21/56 257/686 |
| 2004/0113253 | A1 * | 6/2004 | Karnezos .............. H01L 21/563 257/686 |
| 2004/0212066 | A1 * | 10/2004 | Wang ................ H01L 25/0657 257/686 |
| 2005/0133916 | A1 * | 6/2005 | Karnezos ............ H01L 23/4334 257/738 |
| 2009/0032914 | A1 * | 2/2009 | Kwon et al. ................... 257/664 |
| 2009/0289265 | A1 * | 11/2009 | Roozeboom ........ H01L 25/0657 257/80 |
| 2013/0187260 | A1 * | 7/2013 | Kelkar ................ H01L 23/4951 257/676 |
| 2013/0248894 | A1 * | 9/2013 | Nakamura ............ H01L 33/486 257/88 |
| 2013/0294778 | A1 * | 11/2013 | Kim .................... H04B 10/801 398/135 |
| 2014/0212085 | A1 * | 7/2014 | Margaritis .............. H01L 24/11 385/14 |

\* cited by examiner

US 9,899,794 B2

OPTOELECTRONIC PACKAGE

FIELD

Disclosed embodiments relate to optoelectronic packages which include a photodetector and at least one light source, such as a laser diode or light emitting diode (LED).

BACKGROUND

A variety of optoelectronic devices are packaged devices which include a photodetector (PD) and at least one light source. Conventional optoelectronic packages include a mirror to reflect the light from the light source to the PD. The PD can be on the same substrate as the light source, or on the other side of the package laterally offset from the light source.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize conventional optoelectronic packages having a mirror to reflect the light from the light source to the photodetector (PD) results in significant signal loss and optical cross talk, alignment issues with alignment of the PD, and challenges with component sourcing including the need for custom components. Disclosed embodiments include optoelectronic packages having a package-within-a-package arrangement comprising an inner smaller PD package inside an outer larger (mother) package, where the inner package having first and second external bond pads is oriented upside-down (lid side down) in a direct line of sight with the light source to receive light from at least one light source (e.g., VCSEL) having a first and a second electrode. There is no need for a conventional mirror to reflect the light from the light source to the PD. Disclosed embodiments thus simplify alignment of the PD and significantly lower the assembly cost relative to conventional optoelectronic package solutions.

The PD die has a first contact connected by routing to the first external bond pad and a second contact connected by routing to the second external bond pad. A first wire bond connects the first external bond pad of the PD die to a first terminal of the outer package, and a second wire bond connects the second external bond pad of the PD die to a second terminal of the outer package, a third wire bond connects the first electrode of the light source die to a third terminal of the outer package, and a fourth wire bond connects the second electrode of the light source die to a fourth terminal of the package.

BRIEF DESCRIPTION OF THE DRAWINGS

Reference will now be made to the accompanying drawings, which are not necessarily drawn to scale, wherein.

DETAILED DESCRIPTION

Figure 1A:
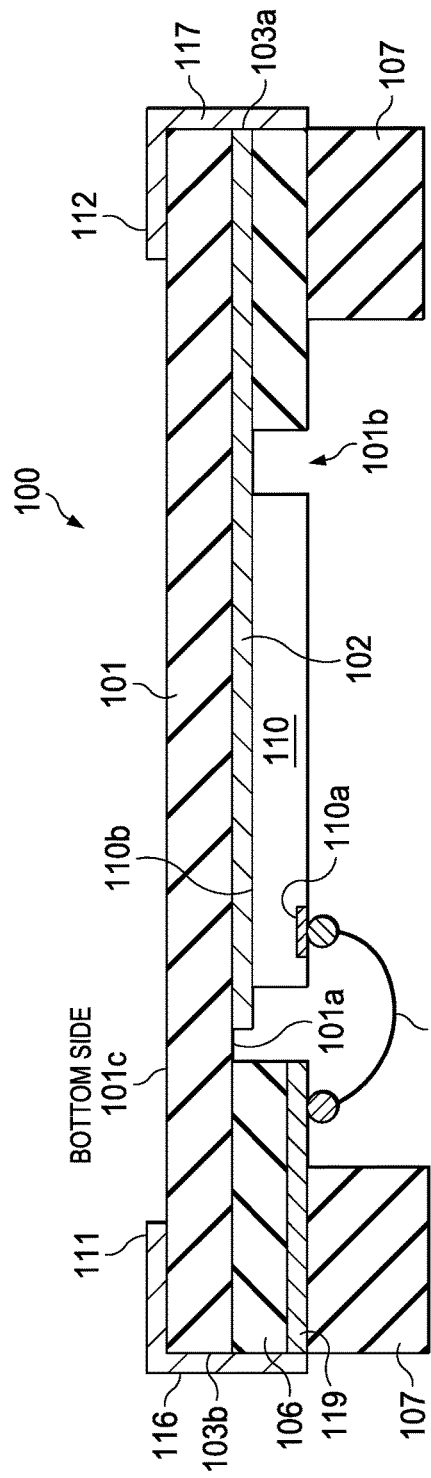
FIG. 1A is a depiction of an example PD package adapted for being the inner package inside an outer package of a disclosed optoelectronic package, where the PD die includes a front contact connected to the first external bond pad by routing comprising an internal bond wire and a second contact connected by routing comprising a back side metal layer to the second external bond pad, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1A is a depiction of an example PD package 100 adapted for being the inner package inside an outer (mother) package of a disclosed optoelectronic package, according to an example embodiment. The PD die 110 includes a first contact comprising a front contact 110a connected to a FEBP 111 by routing comprising an internal bond wire 115 and a second contact comprising a back contact 110b connected by routing comprising a back side metal layer 102 to a SEBP 112.

PD package 100 includes a multi-layer first dielectric substrate including a first dielectric level 101, a second dielectric level 106 above the first dielectric level 101, and a third dielectric level 107 above the second dielectric level 106. As known in the art, the multi-layer first dielectric substrate can be an integral (one-piece) substrate so that the first dielectric level 101, second dielectric level 106 and a third dielectric level 107, together with any intervening metal layer, are configured without the need for any adhesive. For example, ceramic packages have build up layers that allow integrated metal connections laterally and vertically to the reach the outer surface of the package.

When included in a disclosed optoelectronic package, PD package 100 is generally referred to herein as being an "inner package 100". The first dielectric level 101 includes a top side 101a including a first die attach area 101b having a back side metal layer 102 thereon extending to a first outer edge 103a of the PD package 100 and the FEBP 111 and SEBP 112 on a bottom side 101c of the first dielectric level 101. The second dielectric level 106 is above the first dielectric level 101 framing the die attach area 101b including a wire bonding area having a second metal layer 119 extending to the second outer edge 103b of the PD package 100. A first metal trace 116 is on the second outer edge 103b of the PD package 100 connecting the second metal layer 119 to the FEBP 111 and a second metal trace 117 on the first outer edge 103a of the PD package 100 connecting the back side metal layer 102 to the SEBP 112.

The PD die 110 includes a front contact 110a (e.g., bond pad metal connected to an n+ region) and a back contact 110b (e.g., bond pad metal connected to a p+ region) is on the die attach area 101b. The back contact 110b can be the entire bottom side of the PD die 100. An inner wire bond 115 within the PD package 100 connects the front contact 110a to the second metal layer 119.

The PD die 110 can comprise any suitable front-side illuminated PD including a photodiode, a phototransistor or a charge-coupled device (CCD), which all can be off-the-shelf PD die. In one embodiment the PD die includes a first active layer having a first conductivity (e.g., n+), a second active layer having a second conductivity (e.g., p+) opposite the first conductivity, and an intrinsic layer separating the first and second active layers (a pin diode).

The PD package can comprise a ceramic package or a plastic package. One advantage of ceramic packages is the ability to have hermetic sealing. The PD package 100 is shown without a lid as it does not need a lid to hold the PD die upside down. However, a lid can be included provided it is an optically transparent lid. The package type for PD package 100 supports a substrate contact shown as back contact 110b to the bottom of the PD die 110 and to front contact 100a. The electrical contacts are then routed out in some manner to SEBP 112 and FEBP 111, such as through a ceramic substrate. Alternatively, generally any plastic package can be used with a custom leadframe to provide the needed routing.

Figure 1B:
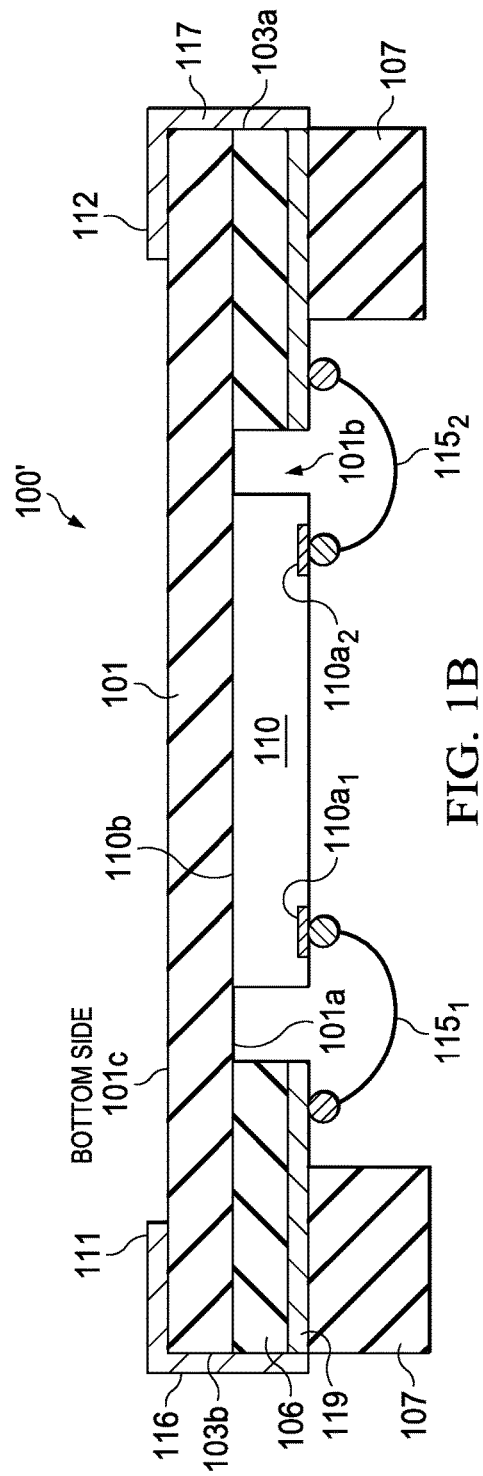
FIG. 1B is a depiction of an example PD package adapted for being the inner package inside an outer package of a disclosed optoelectronic package, where the PD die includes a first front contact connected to the first external bond pad (FEBP) by routing comprising a first internal bond wire and a second front contact connected by routing comprising a second internal bond wire to the second external bond pad (SEBP), according to an example embodiment.

FIG. 1B is a depiction of an example PD package 100' adapted for being the inner package inside an outer package of a disclosed optoelectronic package, where the PD die 110 includes a first front contact 110a1 connected to the FEBP 111 by routing comprising a first internal bond wire $115_1$ and a second front contact 110a2 connected by routing comprising a second internal bond wire $115_2$ to the SEBP 112, according to an example embodiment.

Figure 1C:
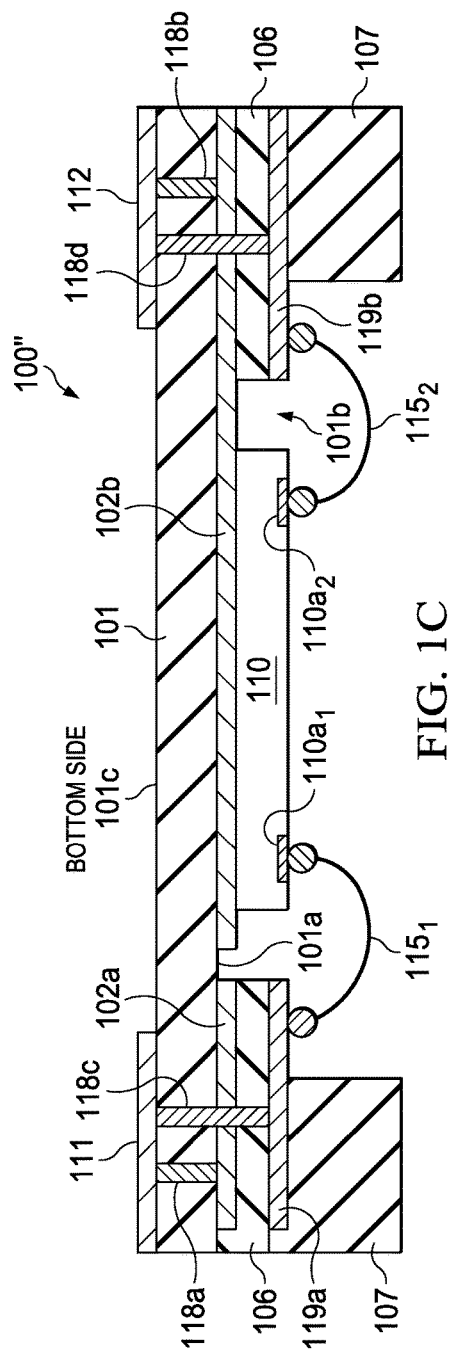
FIG. 1C is a depiction of an example PD package including through-via connections adapted for being the inner package inside an outer package of a disclosed optoelectronic package, where the PD die includes a first front contact connected to the FEBP by routing comprising a first internal bond wire and through-via connections and a second front contact connected by routing comprising a second internal bond wire and through-via connections to the SEBP, according to an example embodiment.

FIG. 1C is a depiction of an example PD package 100" including through-via connections adapted for being the inner package inside an outer package of a disclosed optoelectronic package, according to an example embodiment. The PD die 110 includes a first front contact 110a1 connected to the FEBP 111 by routing comprising a first internal bond wire $115_1$ and a second front contact 110a2 connected by routing comprising a second internal bond wire $115_2$ to the SEBP 112, including through-via connections, the through-via connections are shown including through-vias 118a and 118b which connect the first back side metal portions 102a and 102b to FEBP 111 and SEBP 112, respectively.

The through-via connections are also shown including through-vias 118c and 118d which connect the second metal layer portions 119a and 119b to the first back side metal portions 102a and 102b, respectively and to FEBP 111 and SEBP 112, respectfully. The parallel via connection shown through the first dielectric level 101 is used to reduce resistance as compared to a single via.

Figure 1D:
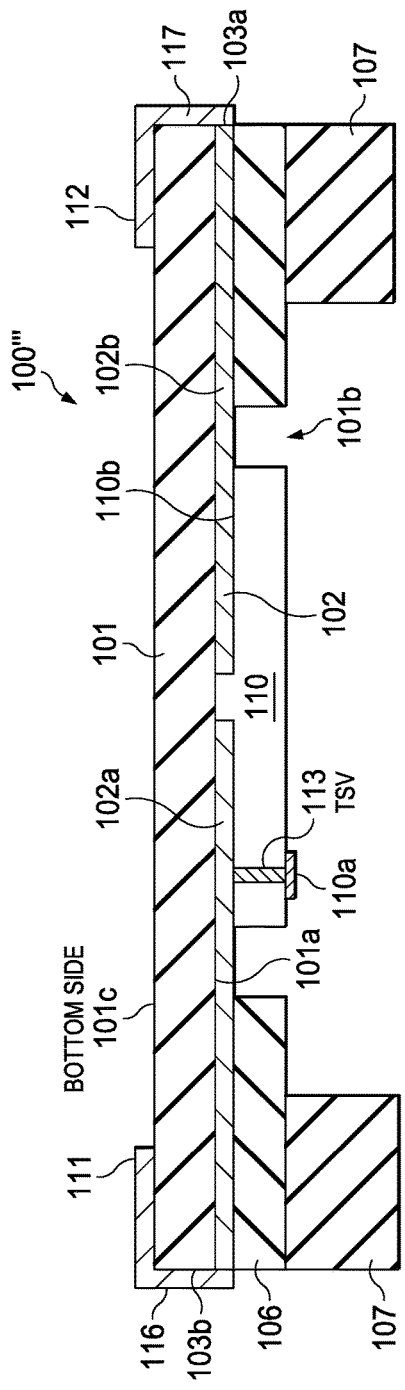
FIG. 1D is a depiction of an example PD package adapted for being the inner package inside an outer package of a disclosed optoelectronic package, where the PD die includes a front contact connected to the FEBP by routing comprising a through-silicon via (TSV) connected to a first back side metal portion and a second contact provided by a back contact 110b connected by routing comprising a second back side metal portion to the SEBP, according to an example embodiment.

FIG. 1D is a depiction of an example PD package 100''' adapted for being the inner package inside an outer package of a disclosed optoelectronic package, where the PD die 110 includes a front contact 110a connected to the FEBP 111 by routing comprising a through-silicon via (TSV) 113 connected to a first back side metal portion 102a and a second contact provided by a back contact 110b connected by routing comprising a second back side metal portion 102b to the SEBP 112, according to an example embodiment. The TSV 113 generally includes a dielectric liner (not shown).

Figure 2A:
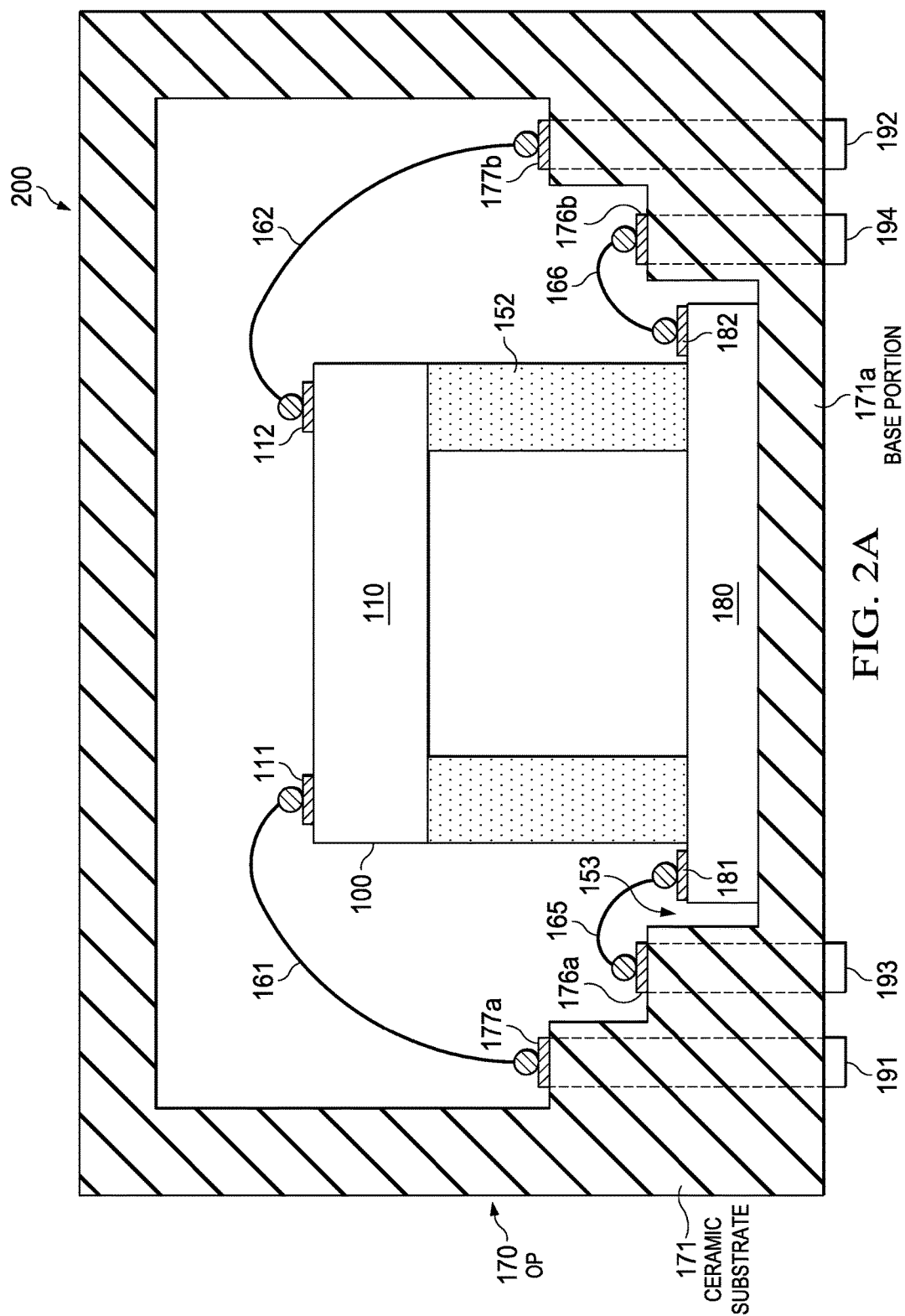
FIG. 2A is a depiction of an example optoelectronic package including the PD package shown in FIG. 1A inside an outer package, according to an example embodiment.

FIG. 2A is a depiction of an example optoelectronic package 200 including the PD package shown in FIG. 1A as an inner package 100 that is assembled inside an outer package 170 (mother package), according to an example embodiment. The outer package (OP) 170 includes a ceramic substrate 171 including base portion 171a, with lower wire (metalized) bond areas 176a, 176b on raised outer portions of the ceramic substrate 171 connected to the third terminal 193 and fourth terminal 194, respectively, and upper wire bond areas 177a, 177b on other raised outer portions of the ceramic substrate 171 connected to the first terminal 191 and second terminal 192, respectively.

At least one light source die 180 including a first electrode 181 and second electrode 182 is on (e.g., attached to) the base portion 171a positioned to face the PD die 110 so that the PD die 110 is in a direct line of sight with an emitting area of the light source die 180. A first cavity die 152 that can comprise a silicon die in one embodiment is shown directly on top of the light source die 180 inside the first electrode 181 and second electrode 182.

The light source die 180 can comprise a vertical-cavity surface-emitting laser (VCSEL) which is known to be a type of semiconductor laser diode with an emission perpendicular from its top surface which includes electrodes comprising an n+ electrical contact a p+ electrical contact. VCSELs can be formed from a wide range of material systems to produce specific device characteristics. In particular, the various material systems can be tailored to emit different wavelengths, such as 1550 nm, 1310 nm, 850 nm, 670 nm, and so on. Disclosed embodiments can generally also use any vertical emitting light source, such as other laser diodes or a light emitting diode (LED).

Optoelectronic package 200 includes a first wire bond 161 connecting the FEBP 111 to the upper wire bond area 177a which is coupled to the first terminal 191 of the OP 170, a second wire bond 162 connecting the SEBP 112 to the upper wire bond area 177b which is coupled to the second terminal 192 of the OP 200. There is also a third wire bond 165 connecting the first electrode 181 to the lower wire bond area 176a which is coupled a third terminal 193 of the OP 170, and a fourth wire bond 166 connecting the second electrode 182 to the lower wire bond area 176b which is coupled to a fourth terminal 194 of the OP 170.

Figure 2B:
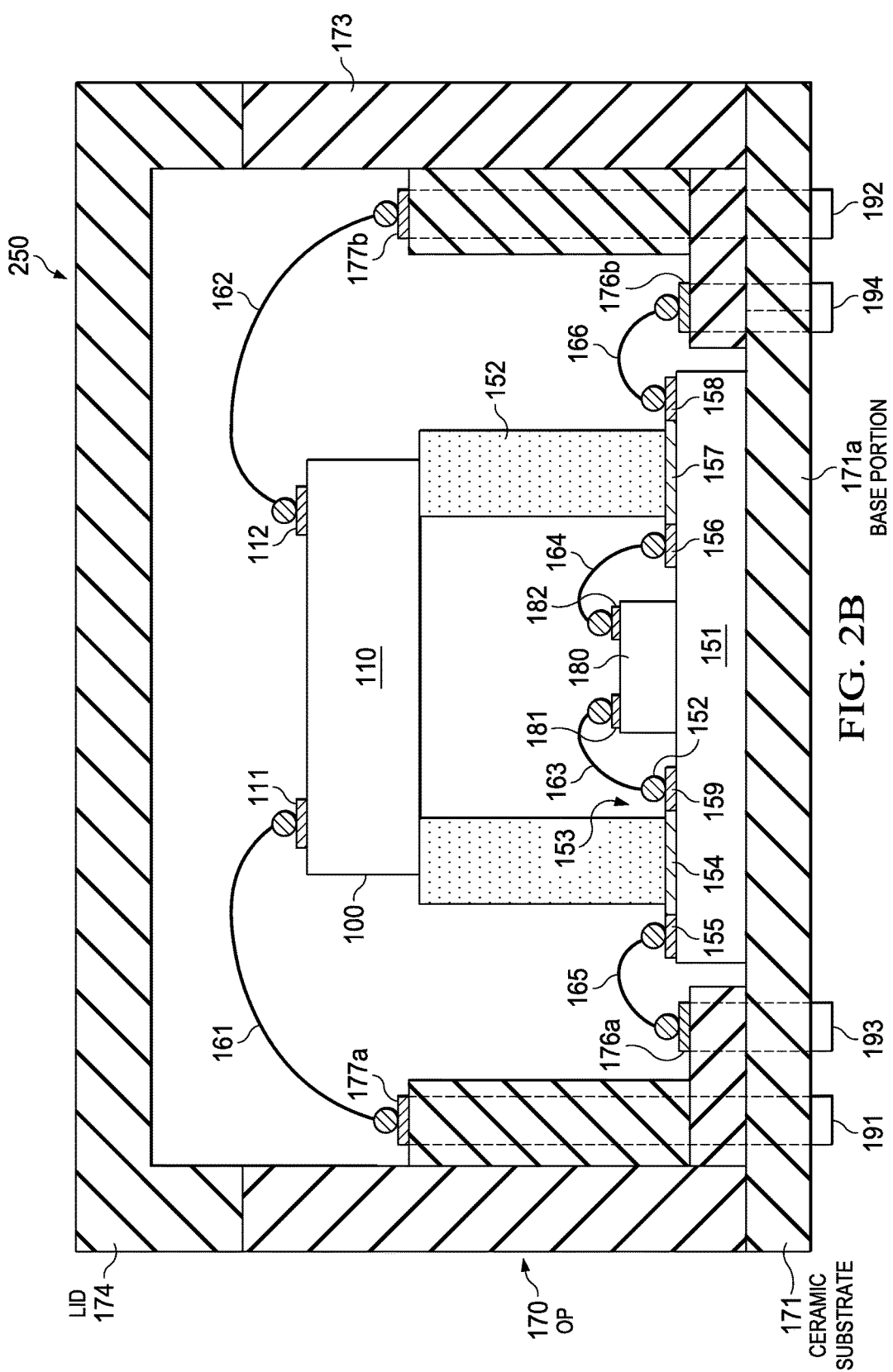
FIG. 2B is a depiction of another example optoelectronic package including the PD package shown in FIG. 1A inside an outer package, according to an example embodiment.

FIG. 2B is a depiction of another example optoelectronic package 250 including the inner package 100 shown in FIG. 1A inside an OP 170, according to another example embodiment. OP 170 can comprise a ceramic package or a plastic package. The OP 170 surrounding the inner package 100 includes the ceramic substrate 171, and a first mounting substrate 151 is on the base portion 171a of the ceramic substrate 171. A first cavity die 152 is on the first mounting substrate 151 which defines a second die attach area 153. A light source die 180 is attached to the first mounting substrate 151 in the second die attach area 153 and is positioned to face the PD die 110 so that the PD die 110 is in a direct line of sight with an emitting area of the light source die 180.

A first wire bond 161 connects the FEBP 111 of the inner package 100 and the upper wire bond area 177a, and a second wire bond 162 connects the SEBP 112 of the inner package 100 to the upper wire bond area 177b. At least a third wire bond (shown as bond wires 163, 165) is in a path including bond pads 159 and 155 and a metal trace 154 coupling bond pad 159 to bond pad 155 on the first mounting substrate 151 connecting the first electrode 181 to a first lower bond area 176a, and at least a fourth wire bond (shown as 164, 166) is in a path connecting including bond pads 156, 158 and another metal trace 157 coupling bond pad 156 to bond pad 158 on the first mounting substrate 151 connecting the second electrode 182 to the lower wire bond area 176b. A lid 174 is shown that can hermetically seal the OP 170.

Figure 3:
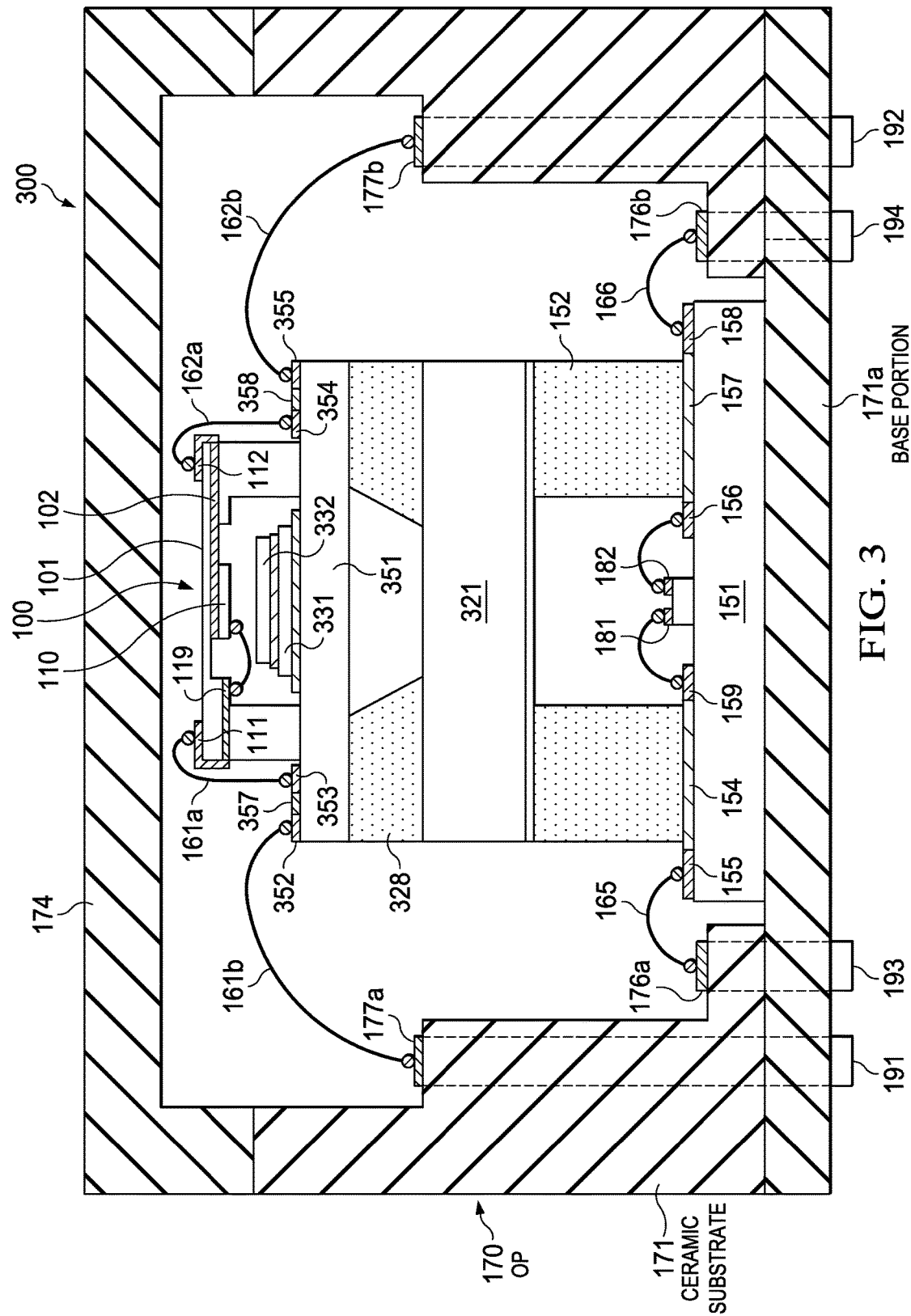
FIG. 3 is a depiction of yet another example optoelectronic package including the PD package shown in FIG. 1A inside an outer package, according to an example embodiment.

FIG. 3 is a depiction of yet another example optoelectronic package 300 including the inner package 100 shown in FIG. 1A inside an OP 170, according to an example embodiment. In this embodiment the inner package 100 is on a second mounting substrate 351 that includes bond pads 352 and 353 coupled together by the metal trace shown 357, and bond pads 354 and 355 coupled together by the metal trace 358 shown. Bond wire 161a connects the FEBP 111 to bond pad 353 and bond wire 161b connects the bond pad 352 to upper wire bond area 177a. Bond wire 162a connects the SEBP 112 to bond pad 354 and bond wire 162b connects bond pad 355 to upper wire bond area 177b.

Optoelectronic package 300 includes a light source die 180 with electrodes 181 and 182 to allow biasing (e.g., electrically pumping) shown in FIG. 3 provided by bond wire 165 from lower bond pad area 176a (connected to third terminal 193) and by bond wire 166 from lower bond pad area 176b (connected to third terminal 194). Light source die 180 can comprise a VCSEL in one specific embodiment. An optics die 321 being a provides quarter wave plate light filter filters light from the light source die 180is shown on the first cavity die 152, and a second cavity die 328 is shown on the optics die 321. Other die shown as die 331 being a quarter wave plate light filter and die 332 being a linear polarizer are shown on the second mounting substrate 351 that can comprise an optical glass, such as a borosilicate glass, for example BOROFLOAT 33.

A method of assembling an example optoelectronic package including the PD package 100" shown in FIG. 1C referred to as an inner package 100 inside an OP package 170 is now described. The dielectric substrate for inner package 100 can be plastic or ceramic. An inner package 100" is first formed or is provided including a first dielectric level 101 having a top side 101a including first metal layer portions 102a and 102b on the top side 101a of first dielectric level 101, and there is a FEBP 111 and a SEBP 112 on a bottom side 101c of the first dielectric level 101.

A through-via 118a connects the first back side metal portion 102a to FEBP 111 and another through-via 118b connects the second back side metal portion 102a to SEBP 112. A second dielectric level 106 is applied over the first dielectric level 101 which frames a first die attach area 101b. Through-vias 118c and 118d are formed through the second dielectric level 106 which are then metal filled which connect to the first back side metal portions 102a and 102b, respectively and to the FEBP 111 and SEBP 112, respectively. Second metal layer portions 119a and 119b are then formed on the second dielectric level 106.

A PD die 110 including at least one front contact 110a and at least one back contact 110b is mounted with its back contact on the die attach area 101b. Inner wire bonds $115_1$ and $115_2$ are bonded within the first package connecting the front contact 110a1 to the second metal layer portion 119a and front contact 110a2 to the second metal layer portion 119b.

The inner package 100 can then be placed on a first mounting substrate 151 in the OP 170 which includes inner bond pads, outer bond pads, and metal traces connecting the inner bond pads and outer bond pads thereon. At least one light source die 180 including a first electrode 181 and second electrode 182 is attached to the first mounting substrate 151. The first electrode 181 and second electrode 182 are wire bonded to the inner bond pads on the substrate 151. A first cavity die 152 is placed on the first mounting substrate 151 which defines a second die attach area 153. The inner package 100 is placed on the first cavity die 152 so that the PD 110 and the emission area of the light source die 180 are in a direct line of sight. The other components shown in FIG. 3 can optionally be interposed between the PD 110 and the light source die 180.

Wire bonding can comprise a first wire bond 161 which connects the FEBP 111 to the first terminal 191 of the OP 170, a second wire bond 162 which connects the SEBP 112 to the second terminal 192 of the OP 170, a third wire bond 165 to an outer bond pad which through a metal trace connects to the first electrode 181 to the third terminal 193 of the OP 170, and a fourth wire bond 166 to an outer bond pad which through a metal trace connects to the second electrode 182 to a fourth terminal 194 of the OP 170. As noted above a lid 174 can then be attached to hermetically seal the OP 170.

Applications for disclosed embodiments generally include all applications having a light source such as a laser diode along with an inbuilt monitor photodetector. One specific example is a magnetometer physics package. Other examples include an atomic clock.

Disclosed embodiments can be integrated into a variety of assembly flows to form a variety of different optoelectronic devices and related products. Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:
1. An optoelectronic package, comprising:
  an inner package including a first dielectric substrate including at least a first dielectric level having a photodetector (PD) die inside said inner package on a die attach area including a first contact and a second contact, first routing connecting said first contact to a first external bond pad (FEBP) and second routing connecting said second contact to a second external bond pad (SEBP);
  said inner package inside an outer package (OP) including a second ceramic substrate including a base portion, at least one light source die including a first electrode and second electrode on said base portion positioned to face said PD die to be in a direct line of sight with an emitting area of said light source die;
  a first wire bond connecting said FEBP to a first terminal of said OP, a second wire bond connecting said SEBP to a second terminal of said OP, a third wire bond connecting said first electrode to a third terminal of said OP, and a fourth wire bond connecting said second electrode to a fourth terminal of said OP; and a cavity die on the light source die and touching the photo detector die.

2. The optoelectronic package of claim 1, wherein said first contact is a front contact connected to said FEBP an internal bond wire and said second contact is connected by a back side metal layer to said second external bond pad.

3. The optoelectronic package of claim 1, wherein said first contact is a first front contact connected to said FEBP by a first internal bond wire and said second contact is a second front contact connected by a second internal bond wire to said SEBP.

4. The optoelectronic package of claim 1, where said first contact is a front contact connected to said FEBP by a through-silicon via (TSV) connected to a first back side metal portion and said second contact is a back contact connected to said SEBP.

5. The optoelectronic package of claim 1, wherein said light source die comprises a laser diode.

6. An optoelectronic package, comprising:
a first package including a photo detector die attached to a first substrate, the photo detector die including a first external bond pad and a second external bond pad;

a second package including a light source die attached to a second substrate, the first package inside the second package, the light source die including a first electrode and a second electrode; and a cavity die on the light source die and touching the photo detector die.

7. The optoelectronic package of claim 6, wherein the photo detector die and the light source die have a direct line of sight via a cavity of the cavity die.

8. The optoelectronic package of claim 6, wherein the cavity die is on the light source die in between the first electrode and the second electrode.

9. The optoelectronic package of claim 6, wherein the first external bond pad is electrically coupled to a first terminal of the second package via a first wire bond and the second external bond pad is electrically coupled to a second terminal of the second package via a second wire bond.

10. The optoelectronic package of claim 9, wherein the first electrode is electrically coupled to a third terminal of the second package via a third wire bond and the second electrode is electrically coupled to a fourth terminal of the second package via a fourth wire bond.

11. The optoelectronic package of claim 6, wherein said light source die comprises a laser diode.

* * * * *